(12) United States Patent
Park et al.

(10) Patent No.: US 7,164,159 B2
(45) Date of Patent: Jan. 16, 2007

(54) LED PACKAGE

(75) Inventors: Joung Uk Park, Kyungki-do (KR);
Seoung Ju Moon, Kyungki-do (KR);
Seung Hwan Choi, Gangwon-do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 85 days.

(21) Appl. No.: 10/834,175

(22) Filed: Apr. 29, 2004

(65) Prior Publication Data

US 2005/0110036 A1    May 26, 2005

(30) Foreign Application Priority Data

Nov. 20, 2003    (KR) .................... 10-2003-0082477

(51) Int. Cl.
*H01L 29/22*    (2006.01)
(52) U.S. Cl. .......................... 257/99; 257/98
(58) Field of Classification Search .............. 257/99, 257/98
See application file for complete search history.

(56) References Cited

U.S. PATENT DOCUMENTS

| | | | |
|---|---|---|---|
| 4,241,281 A | * 12/1980 | Morimoto et al. | .......... 315/161 |
| 6,583,447 B1 | 6/2003 | Wang et al. | |
| 6,667,497 B1 | 12/2003 | Huang et al. | |

FOREIGN PATENT DOCUMENTS

| | | |
|---|---|---|
| JP | 50-107850 | 8/1975 |
| JP | 63-170142 | 11/1988 |
| JP | 5-25752 | 4/1993 |
| JP | 5-145117 | 6/1993 |
| JP | 2001-358371 | 12/2001 |
| JP | 2002-94122 | 3/2002 |
| JP | 2002-314138 | 10/2002 |
| JP | 2002-335019 | 11/2002 |

OTHER PUBLICATIONS

Japanese Patent Office, Office Action, mailed Oct. 24, 2006.

* cited by examiner

*Primary Examiner*—Sara Crane
(74) *Attorney, Agent, or Firm*—Lowe Hauptman & Berner, LLP.

(57) ABSTRACT

An LED package includes a substrate, internal electrodes provided in an even ($2n$) number and formed on an upper surface of the substrate, external electrodes provided in the even ($2n$) number, formed on at least a part of surfaces of the substrate other than the upper surface of the substrate, and electrically connected to the corresponding internal electrodes, and LEDs provided in the even ($2n$) number, located on the upper surface of the substrate, and provided with an anode and a cathode. The anodes and cathodes of the LEDs are electrically connected to the internal electrodes such that the anode of each of the LEDs is connected to the anode of a neighboring one of the LEDs and the cathode of each of the LEDs is connected to the cathode of another neighboring one of the LEDs.

14 Claims, 4 Drawing Sheets

LED PACKAGE

BACKGROUND OF THE INVENTION

1. Field of the Invention

The present invention relates to an LED package, and more particularly to an LED package, in which an anode and a cathode of each of LEDs provided in an even (2n) number are electrically connected to an anode of a neighboring LED and a cathode of another neighboring LED, thereby individually operating each of the LEDs provided in the even (2n) number and allowing characteristics of each of the LEDs to be easily tested.

2. Description of the Related Art

LED displays, which serve as media for communicating information, were originally developed to provide character or numerical information, and are being developed now to provide moving pictures, such as various CF images, graphics and video pictures. Further, the LED displays have progressed from displaying a limited range of visible colors by means of red and yellowish green LEDs to displaying the full range of visible colors including red, yellowish green and blue colors by means of a GaN-based high-luminance blue LED, a pure green LED and an ultraviolet LED.

Since the LED displays are being developed to display the full range of visible colors with high quality, there has now been proposed an outdoor LED display having a large size of 100 inches or more. Such an outdoor LED display is combined with a computer, thus serving as the newest image display media, which upgrades the level of commercial advertisements and displays various picture information including news in real-time. Particularly, a flash manufactured using an LED is mounted on a portable telephone terminal so that a user of the portable telephone terminal provided with a small-sized camera installed therein can take a picture even at night. An LED package, which is manufactured by assembling a plurality of LEDs into one unit, is used as the above flash mounted on the portable telephone terminal.

FIG. 1a is a circuit diagram illustrating a connection structure between LEDs used in a conventional LED package. As shown in FIG. 1a, a conventional LED package 11 comprises four LEDs 12, 13, 14 and 15, in which the two LEDs 12 and 13 are connected in parallel and the two LEDs 14 and 15 are connected in parallel. Accordingly, the conventional LED package 11 requires four terminals 11a, 11b, 11c and 11d.

Generally, a producer of LED packages tests characteristics of a produced LED package, such as driving voltage, voltage, luminance, etc., so as to provide information regarding the characteristics of the LED package. Such a test procedure includes a step of testing electrical characteristics of respective LEDs by applying voltage to each of the terminals of the LED package so as to obtain characteristics of the respective LEDs used in the LED package.

During the above test procedure, the LED package 11 as shown in FIG. 1a, comprising four LEDs 12, 13, 14 and 15, in which the two LEDs 12 and 13 are connected in parallel and the two LEDs 14 and 15 are connected in parallel, causes a difficulty in obtaining characteristics of each of the respective LEDs 12, 13, 14 and 15. Accordingly, in case that one of the four LEDs 12, 13, 14 and 15 fails, it is not easy to detect the failure of one LED through an electrical test. For example, in case that the LED 14 in FIG. 1a fails, a producer applies voltage to the terminals 11a and 11b, and to the terminals 11c and 11d, thereby testing electrical characteristic of the LED package 10. Here, since the LEDs 14 and 15 are connected in parallel, the electrical characteristics between the terminals 11c and 11d when the LED 14 has failed are the same as the electrical characteristics between the terminals 11c and 11d when the LED 14 has not failed, i.e., when the LED 14 is in a normal state. Accordingly, the producer cannot detect the failure of the LED 14 through the electrical test, thus being incapable of providing precise characteristics of the LED package 10 to consumers.

FIG. 1b is a circuit diagram illustrating a connection structure between LEDs used in another conventional LED package. As shown in FIG. 1b, a conventional LED package 21 comprises three LEDs 22, 23 and 24, each of which has both ends connected to different terminals. That is, both ends of the LED 22 are respectively connected to terminals 21a and 21b, both ends of the LED 23 are respectively connected to terminals 21c and 21d, and both ends of the LED 24 are respectively connected to terminals 21e and 21f. The conventional LED package 21 comprises the three LEDs 22, 23 and 24, each of which has both ends connected to different two terminals, thus not causing a difficulty in obtaining characteristics of each of the respective LEDs 22, 23 and 24 differently from the earlier-described conventional LED package 11. However, the conventional LED package 21 causes a difficulty in testing a large number of the terminals of the LEDs to the producer. Particularly, since the number of the terminals in the connection structure of the conventional LED package 21 in FIG. 1b is twice as many as that of the terminals in the connection structure of the conventional LED package 11 in FIG. 1a, the test procedure of the conventional LED package 21 is complicated and time taken for testing the conventional LED package 21 is increased compared to the conventional LED package 11. Further, since external electrode being equal in number to that of the terminals are installed outside the LED package 21, the conventional LED package 21 is disadvantageous in that the required number of the external electrodes is increased and it is difficult to miniaturize the LED package 21.

Accordingly, there is required a novel LED package, in which electrical characteristics of each of respective LEDs are easily tested and light emitting efficiency is improved by a connection structure between the LEDs.

SUMMARY OF THE INVENTION

Therefore, the present invention has been made in view of the above problems, and it is an object of the present invention to provide an LED package, in which electrical characteristics of each of respective LEDs are easily tested, thereby providing precise characteristics of an LED package product to consumers and improving satisfaction of the consumers.

In accordance with the present invention, the above and other objects can be accomplished by the provision of an LED package comprising: a substrate; internal electrodes provided in an even (2n) number and formed on an upper surface of the substrate; external electrodes provided in the even (2n) number, formed on at least a part of surfaces of the substrate other than the upper surface of the substrate, and electrically connected to the corresponding internal electrodes; and LEDs provided in the even (2n) number, located on the upper surface of the substrate, and provided with an anode and a cathode, wherein the anodes and cathodes of the LEDs are electrically connected to the internal electrodes such that the anode of each of the LEDs is connected to the anode of a neighboring one of the LEDs and the cathode of each of the LEDs is connected to the cathode of another neighboring one of the LEDs.

Preferably, the LED package may further comprise a dam, having a designated height, formed at an edge of the upper surface of the substrate so that the LEDs provided in the even (2n) number are surrounded by the dam, and sealed with epoxy. Further, preferably, the dam may be provided with a tilted inner surface, and made of polyphthalamide. Preferably, the epoxy may include a non-YAG fluorescent substance containing Tb, Al, O, and Ce.

Further, preferably, the anodes and cathodes of the LEDs may be electrically connected to the internal electrodes by a wire-bonding method, and the LEDs may be LED flip chips.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENT

Now, preferred embodiments of the present invention will be described in detail with reference to the annexed drawings.

Figure 1:
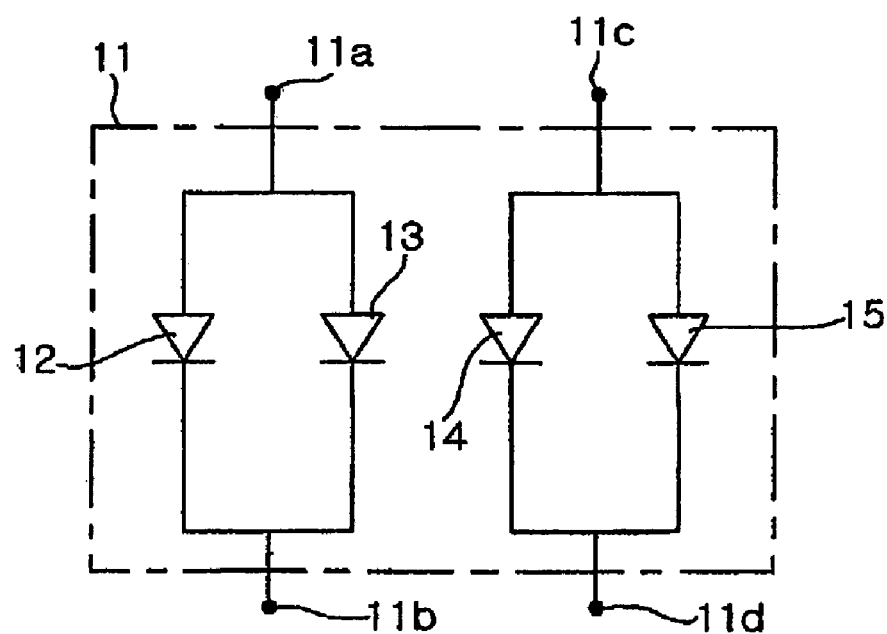
FIGS. 1a and 1b are circuit diagrams respectively illustrating connection structures between LEDs used in conventional LED packages.
Figure 1:
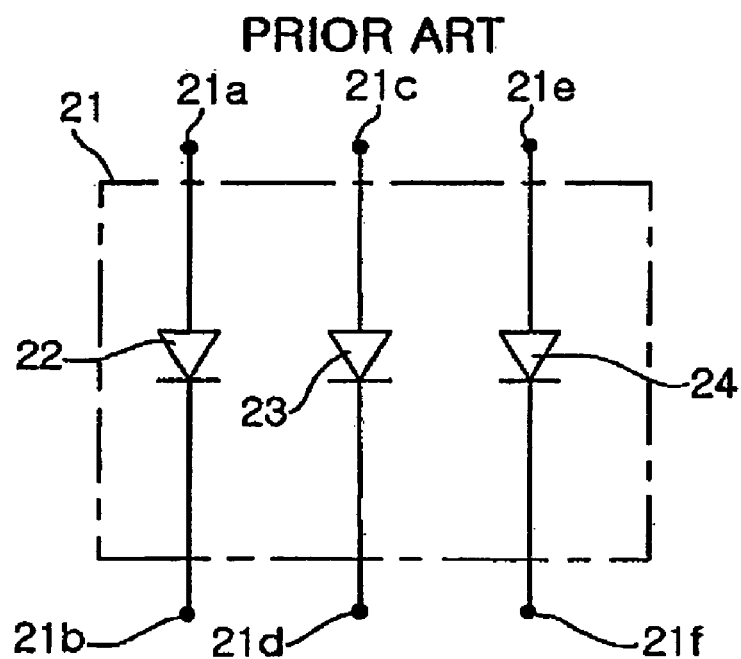
Figure 2:
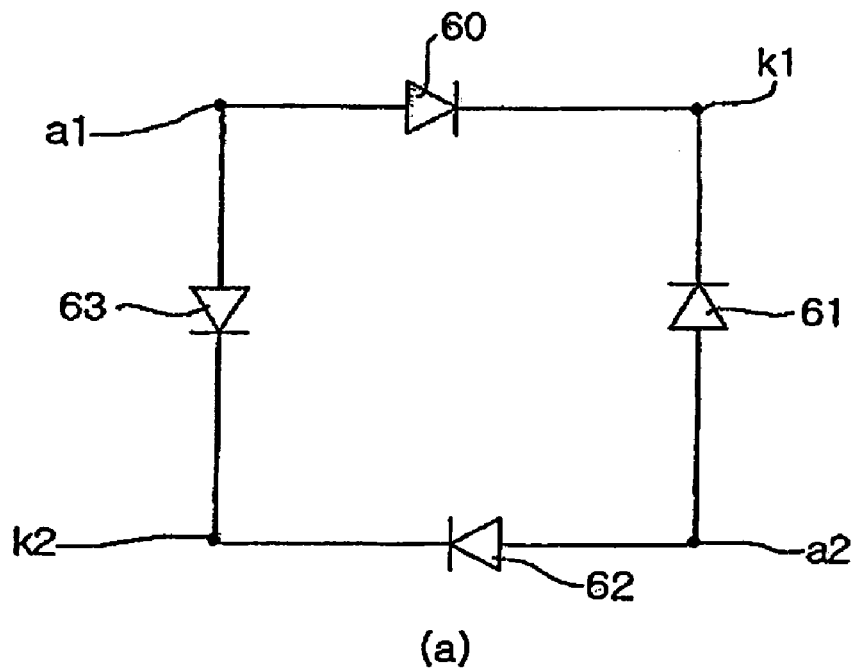
FIGS. 2a and 2b are circuit diagrams respectively illustrating connection structures between LEDs used in LED packages in accordance with preferred embodiments of the present invention.
Figure 2:
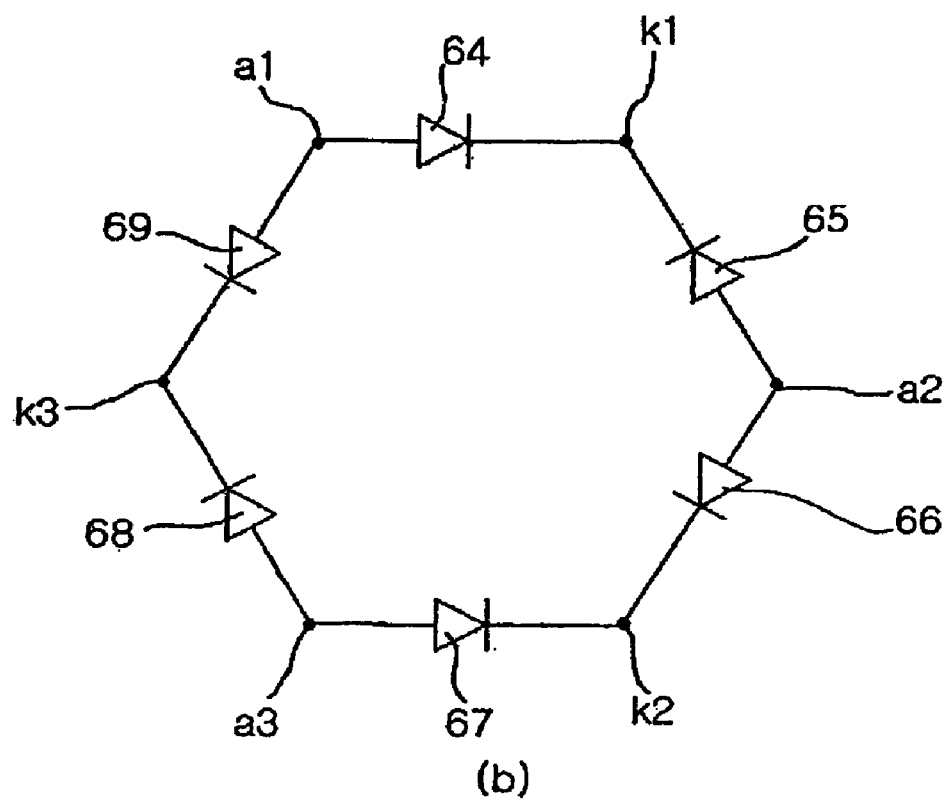

FIGS. 2a and 2b are circuit diagrams respectively illustrating connection structures between LEDs used in LED packages in accordance with preferred embodiments of the present invention. FIG. 2a is a circuit diagram illustrating an LED connection structure of an LED package, which comprises four LEDs, in accordance with one embodiment of the present invention. FIG. 2b is a circuit diagram illustrating an LED connection structure of an LED package, which comprises six LEDs, in accordance with another embodiment of the present invention. The LED package of the present invention uses LEDs provided in an even (2n) number. The above LED connection structures as shown in FIGS. 2a and 2b have been made only for a better understanding of the preferred embodiments of the present invention, and do not limit the present invention.

The LED package of the present invention uses LEDs provided in an even (2n) number, in which anodes and cathodes of the LEDs are electrically connected to internal terminals such that the anode of one LED is connected to the anode of another LED and the cathode of the former is connected to the cathode of yet another LED. Hereinafter, the above characteristics of the present invention will be described in detail with reference to FIGS. 2a and 2b.

FIG. 2a illustrates a connection structure between four LEDs in an LED package in accordance with one embodiment of the present invention. As shown in FIG. 2a, the cathode of a first LED 60 and the cathode of a second LED 61 are connected to a first cathode terminal k1, and the anode of the first LED 60 and the anode of a fourth LED 63 are connected to a first anode terminal a1. In the same manner, the anode of a third LED 62 and the anode of the second LED 61 are connected to a second anode terminal a2, and the cathode of the third LED 62 and the cathode of the fourth LED 63 are connected to a second cathode terminal k2.

Since the anodes and cathodes of the first, second, third and fourth LEDs 60, 61, 62 and 63 of the LED package of this embodiment of the present invention are connected in the above-described structure, the total number of the terminals of the LED package is the same as the number of the first, second, third and fourth LEDs 60, 61, 62 and 63, and each terminal is connected to the same poles of the two LEDs of the first, second, third and fourth LEDs 60, 61, 62 and 63. Compared to the above-described conventional LED connection method in which two LEDs are connected in parallel, the connection method of this embodiment of the present invention requires the same total number of the terminals, while each LED in the connection method of this embodiment of the present invention uses two terminals, thereby allowing characteristics of each LED to be easily tested. For example, in case that voltage is applied to the first anode terminal a1 and the first cathode terminal k1, characteristics of the first LED 60 are tested, and in case that voltage is applied to the first cathode terminal k1 and the second anode terminal a2, characteristics of the second LED 61 are tested. Characteristics of each of the third and fourth LEDs 62 and 63 are tested in the same manner.

Further, compared to the conventional LED package having an LED connection structure in which the anode and cathode of each of the LEDs are connected to different terminals, the LED package of the present invention has a reduced number of terminals (i.e., the conventional LED package, which comprises four LEDs, requires eight terminals), thereby being capable of being miniaturized in size.

FIG. 2b illustrates an LED connection structure in an LED package, which comprises six LEDs 64 to 69, in accordance with another embodiment of the present invention. The LED package of FIG. 2b has the same LED connection structure as that of the LED package of FIG. 2a. That is, anodes of two LEDs out of the six LEDs 64 to 69 are connected to each of anode terminals a1, a2 and a3, and cathodes of two LEDs out of the six LEDs 64 to 69 are connected to each of cathode terminals k1, k2 and k3, thereby allowing the LED connection structure to have a loop shape. In case that voltage is applied to two neighboring terminals selected from the anode terminals a1, a2 and a3 and the cathode terminals k1, k2 and k3, electrical characteristics of the LED connected to the two neighboring terminals are easily tested. The conventional LED package, in which anodes and cathodes of the six are LEDs respectively connected to different terminals, requires twelve terminals. However, the LED package having the above LED connection structure in accordance with this embodiment of the present invention requires six terminals, thereby being capable of being miniaturized in size.

The LED package of the present invention having the above-described LED connection structure is not limited to the number of the LEDs, such as four or six as shown in FIGS. 2a and 2b, and may have LEDs provided in any even (2n) number.

Hereinafter, a constitution of the LED package in accordance with one embodiment of the present invention will be described in detail.

Figure 3:
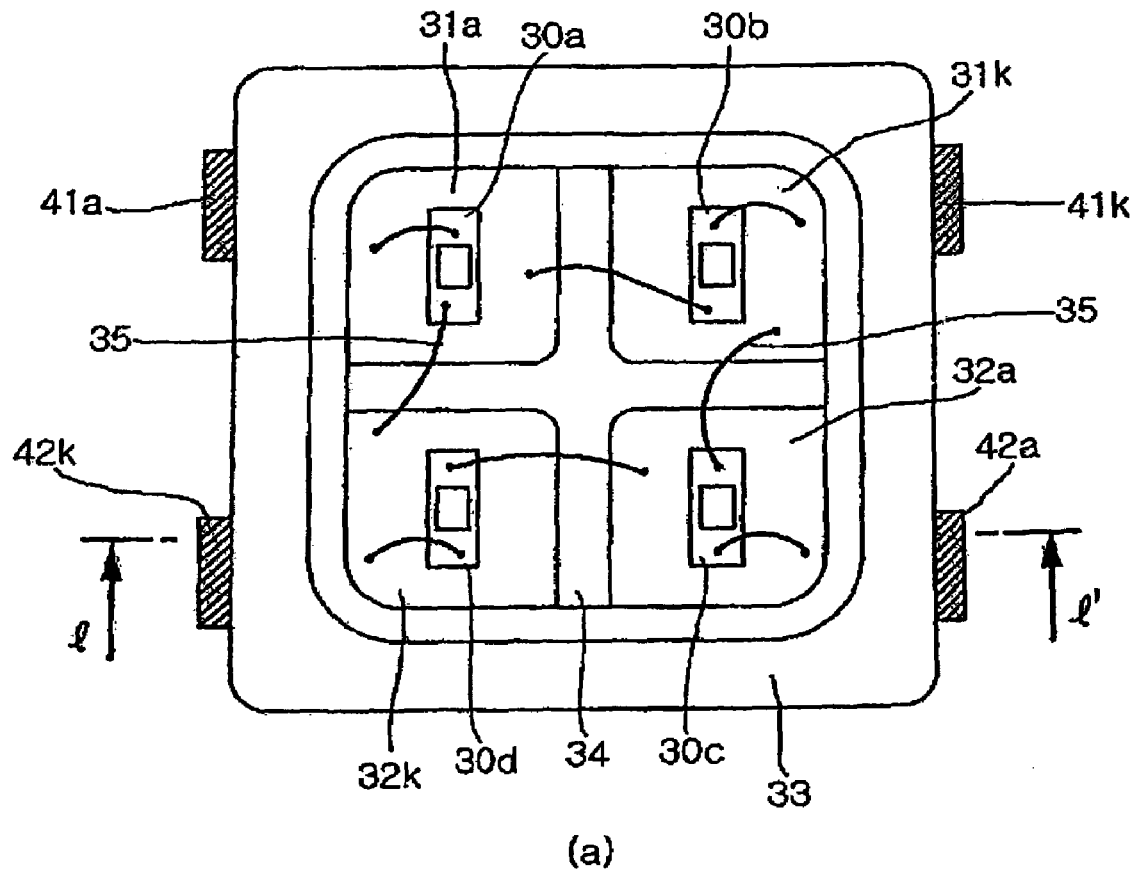
FIG. 3a is a plan view of an LED package in accordance with one embodiment of the present invention.
FIG. 3b is a cross-sectional view of the LED package in accordance with one embodiment of the present invention.
Figure 3:
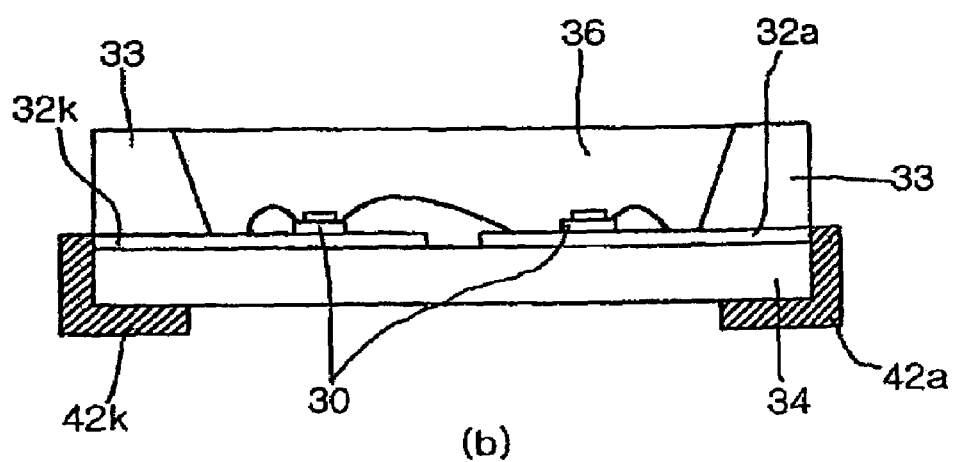

FIG. 3a is a plan view of an LED package in accordance with one embodiment of the present invention. FIG. 3b is a cross-sectional view, which is taken along the line I–I', of the LED package of FIG. 3a. As shown in FIGS. 3a and 3b, the LED package of this embodiment comprises four LEDs. However, those skilled in the art will appreciated that the present invention is not limited to this embodiment.

As shown in FIGS. 3a and 3b, the LED package in accordance with one embodiment of the present invention comprises a substrate 34, four internal electrodes 31a, 31k, 32a and 32k formed on an upper surface of the substrate 34, four external electrodes 41a, 41k, 42a and 42k formed on at least a part of surfaces of the substrate 34 other than the upper surface and electrically connected to the respective internal electrodes 31a, 31k, 32a and 32k, four LED flip chips 30a, 30b, 30c and 30d located on the upper surface of the substrate 34 and provided with an anode and a cathode, and a dam 33 having a designated height formed at an edge of the upper surface of the substrate 34 so that the four LED flip chips 30a, 30b, 30c and 30d are surrounded by the dam 30.

The substrate 34 is a general insulating substrate made of a material such as ceramic, etc.

The four internal electrodes include a first internal electrode 31a, a second internal electrode 31k, a third internal electrode 32a, and a fourth internal electrode 32k. The respective internal electrodes 31a, 31k, 32a and 32k, which are formed on the upper surface of the substrate 34, are separated from each other. The internal electrodes 31a, 31k, 32a and 32k serve as terminals, to which the anodes and cathodes of the LED flip chips 30a, 30b, 30c and 30d are connected. Since the internal electrodes 31a, 31k, 32a and 32k must be electrically connected to the external electrodes 41a, 41k, 42a and 42k, it is preferable that the internal electrodes 31a, 31k, 32a and 32k are extended to the surface of the substrate 34 provided with the external electrodes 41a, 41k, 42a and 42k. For example, in case that the external electrodes 42a and 42k are formed on designated portions of the side and lower surfaces of the substrate 34 as shown in FIG. 3b, it is preferable that the internal electrodes 32a and 32k are extended to the corresponding side surfaces of the substrate 34. There is another method of forming through holes through the substrate 34 for electrically connecting the internal electrodes 31a, 31k, 32a and 32k and the external electrodes 41a, 41k, 42a and 42k. Such a method of forming the through holes causes a process for manufacturing the LED package to require an additional step (of forming the through holes), thus being less desirable than the former.

Preferably, the internal electrodes 31a, 31k, 32a and 32k are made of copper plated with gold so as to improve conductivity.

The four external electrodes include a first external electrode 41a, a second external electrode 41k, a third external electrode 42a and a fourth external electrode 42k, and are formed on at least a part of surfaces of the substrate 34 other than the upper surface of the substrate 34. Each of the external electrodes 41, 42k, 42a and 42k is electrically connected to the corresponding one of the internal electrodes 31a, 31k, 32a and 32k. For example, the first external electrode 41a is connected to the first internal electrode 31a, the second external electrode 41k is connected to the second internal electrode 31k, the third external electrode 42a is connected to the third internal electrode 32a, and the fourth external electrode 42k is connected to the fourth internal electrode 32k. In this embodiment, each of the external electrodes 41a, 41k, 42a and 42k is extended from a designated portion of the side surface of the substrate 34 to a designated portion of the lower surface of the substrate 34. As shown in FIG. 3b, the third external electrode 42a contacts the third internal electrode 32a on one side surface of the substrate 34 so that the third external and internal electrodes 42a and 32a are electrically connected, and the fourth external electrode 42k contacts the fourth internal electrode 32k on another side surface of the substrate 34, being opposite to the side surface of the substrate 34 provided with the third external electrode 42a, so that the fourth external and internal electrodes 42k and 32k are electrically connected. Although not shown in FIG. 3b, the first external and internal electrodes 41a and 31a and the second external and internal electrodes 41k and 31k are electrically connected in the same manner.

The external electrodes 41a, 41k, 42a and 42k serve to electrically connect the LED package to a printed circuit board, thereby transmitting external power to the internal electrodes 31a, 31k, 32a and 32k. Preferably, in the same manner as the internal electrodes 31a, 31k, 32a and 32k, the external electrodes 41a, 41k, 42a and 42k are made of copper plated with gold so as to improve conductivity.

Figure 4:
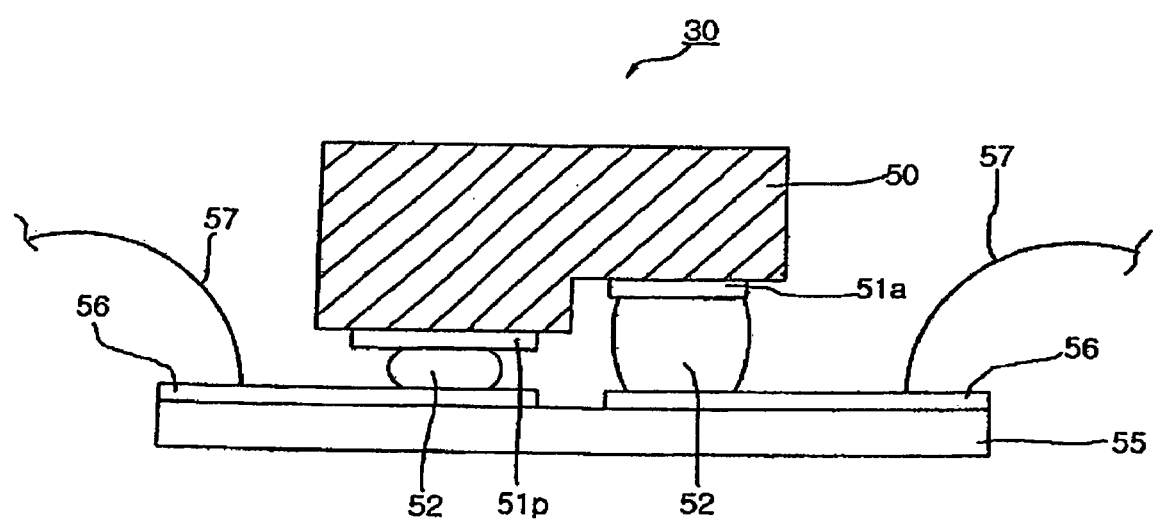
FIG. 4 is a cross-sectional view of an LED flip chip in accordance with one embodiment of the present invention.

Each of the four LED flip chips 30a, 30b, 30c and 30d is provided with two poles, i.e., anode and cathode, and located on the upper surface of the substrate 34. This embodiment of the present invention uses the LED flip chips 30a, 30b, 30c and 30d as LED elements. FIG. 4 is a cross-sectional view illustrating a structure of an LED flip chip 30 in accordance with one embodiment of the present invention. With reference to FIG. 4, the LED flip chip 30 includes an Si substrate 55 provided with two electrodes 56a and 56b formed on an upper surface thereof, an LED 50 provided with an n-type electrode (cathode) 51n and a p-type electrode (anode) 51p, and bumps 52 for directly connecting the n-type electrode 51n and the p-type electrode 51p of the LED 50 to the two electrodes 56a and 56b of the Si substrate 55. Power is supplied to the LED 50 by a wire 57 connecting an external power supply terminal to the two electrodes 56a and 56b of the Si substrate 55. Comparing a conventional wire bonding method, this method using such an LED flip chip 30 has excellent heat dissipating effects and improved luminance. Accordingly, it is preferable that the LED 50 of the present invention employs the flip chip method.

The four LED flip chips 30a, 30b, 30c and 30d are electrically connected to the internal electrodes 31a, 31k, 32a and 33k by the method as shown in FIG. 2a. With reference to FIG. 3a, the anode of the first LED flip chip 30a is electrically connected to the first internal electrode 31a, and the cathode of the first LED flip chip 30a is electrically connected to the fourth internal electrode 32k. The anode of the second LED flip chip 30b is electrically connected to the first internal electrode 31a, and the cathode of the second LED flip chip 30b is electrically connected to the second internal electrode 31k. The anode of the third LED flip chip 30c is electrically connected to the third internal electrode 32a, and the cathode of the third LED flip chip 30c is electrically connected to the second internal electrode 31k. The anode of the fourth LED flip chip 30d is electrically connected to the third internal electrode 32a, and the cathode of the fourth LED flip chip 30d is electrically connected to the fourth internal electrode 32k. That is, the first, second, third and fourth internal electrodes 31a, 31k, 32a and 32k as shown in FIG. 3a respectively correspond to the first anode terminal a1, the first cathode terminal k1, the second anode terminal a2 and the second cathode terminal k2 as shown in FIG. 2a. Further, the first, second, third and fourth LED flip chips 30a, 30b, 30c and 30d as shown in FIG. 3a respectively correspond to the fourth LED 63, the first LED 60, the second LED 61 and the third LED 62 as shown in FIG. 2a. The anodes and cathodes of the LED flip chips 30a, 30b, 30c and 30d are electrically connected to the internal electrodes 31a, 31k, 32a and 32k such that the anode of one of the LED flip chips 30a, 30b, 30c and 30d is connected to the anode of a neighboring one of the LED flip chips 30a, 30b, 30c and 30d, and the cathode of the former is connected to the cathode of another neighboring one of the LED flip chips 30a, 30b, 30c and 30d. Preferably, the above connections between the anodes and cathodes of the LED flip chips 30a, 30b, 30c and 30d and the internal electrodes 31a, 31k, 32a and 32k are achieved by gold wires.

The LED package of this embodiment comprises the dam 33 having a designated height formed at an edge of the upper surface of the substrate 34 so that the four LED flip chips 30a, 30b, 30c and 30d are surrounded by the dam 30. The dam 33 is formed at the edge of the upper surface of the substrate 34, thereby surrounding the four LED flip chips 30a, 30b, 30c and 30d. In order to reflect light, which is emitted from the LED flip chips 30a, 30b, 30c and 30d toward the dam 33, from the inside of the dam 33 to the top of the dam 33 for improving luminance of the LED package, it is preferable that the inner surface of the dam 33 is tilted toward a central area of the substrate 34. Further, it is preferable that the dam 33 is made of a resin having a high optical reflectivity such as polyphthalamide.

The inside of the dam 30 is sealed by epoxy 36. The epoxy 36 employs transparent epoxy. In case that a wavelength of light, which is emitted from the LED flip chips 30a, 30b, 30c and 30d toward the dam 33, is converted to produce another colored light, the inside of the dam 30 is sealed by a mixture of a fluorescent substance and the epoxy 36. Fluorescent substances are divided into two types, such as YAG (Yttrium (Y)-aluminum (Al)-Garnet (G)) fluorescent substances and non-YAG fluorescent substances. The mixture for sealing the inside of the dam 30 of the LED package in accordance with this embodiment of the present invention does not employ the YAG fluorescent substance having a difficulty in uniformly converting a wavelength of light due to precipitation of the fluorescent substance, but employs the non-YAG fluorescent substance containing Tb, Al, O, and Ce.

As described above, an LED package of the present invention, in which the anode and cathode of each of the LEDs are connected to internal electrodes such that the anode of each of the LEDs is connected to the anode of a neighboring LED and the cathode of each of the LEDs is connected to the cathode of another neighboring LED, thereby allowing electrical characteristics of each of the LEDs to be easily tested, and in case that one LED fails, allowing the failed LED to be easily detected. Further, each of the LEDs of the LEP package of the present invention is not connected to two terminals, thereby reducing the total number of required terminals and causing the LED package to be miniaturized in size and light in weight.

As apparent from the above description, the present invention provides an LED package comprising LEDs provided in an even (2n) number, in which an anode and a cathode of each of LEDs are electrically connected to internal electrodes such that the anode of each of the LEDs is connected to the anode of a neighboring LED and the cathode of each of the LEDs is connected to the cathode of another neighboring LED, thus allowing characteristics of each of the LEDs to be tested individually. Thereby, it is possible to provide precise information regarding characteristics of the LED package to consumers and to improve consumers' satisfaction.

Further, each of the LEDs of the LED package does not employs two terminals, thus reducing the total number of required terminals and allowing the LED package to be miniaturized in size and light in weight.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An LED package comprising:
   a substrate;
   internal electrodes provided in an even (2n) number and formed on an upper surface of the substrate;
   external electrodes provided in the even (2n) number, formed on at least a part of surfaces of the substrate other than the upper surface of the substrate, and electrically connected to the corresponding internal electrodes; and
   LEDs provided in the even (2n) number, and located on the upper surface of the substrate, each said LED having an anode and a cathode;
   wherein the anodes and cathodes of the LEDs are electrically connected to the internal electrodes, the anode of each of the LEDs is connected to the anode of a neighboring one of the LEDs and the cathode of each of the LEDs is connected to the cathode of another neighboring one of the LEDs.

2. The LED package as set forth in claim 1, further comprising a dam, having a designated height, formed at an edge of the upper surface of the substrate so that the LEDs provided in the even (2n) number are surrounded by the dam, and sealed with epoxy.

3. The LED package as set forth in claim 2, wherein the dam is provided with a tilted inner surface.

4. The LED package as set forth in claim 2, wherein the dam is made of polyphthalamide.

5. The LED package as set forth in claim 2, wherein the epoxy includes a non-YAG fluorescent substance containing Tb, Al, O, and Ce.

6. The LED package as set forth in claim 1, wherein the anodes and cathodes of the LEDs are electrically connected to the internal electrodes by bonding wires.

7. The LED package as set forth in claim 1, wherein the LEDs are LED flip chips.

8. An LED package comprising:
   a substrate;
   an even (2n) number of internal electrodes located on an upper surface of the substrate;
   the even (2n) number of external electrodes located on at least one surface of the substrate other than said upper surface, said external electrodes being electrically connected to the corresponding internal electrodes; and
   the even (2n) number of LEDs located on the upper surface of the substrate, each said LED having an anode and a cathode;
   wherein the anodes and cathodes of the LEDs are directly electrically connected to the internal electrodes, the anode of each of the LEDs is directly electrically connected to the anode of a neighboring one of the LEDs, and the cathode of each of the LEDs is directly electrically connected to the cathode of another neighboring one of the LEDs.

9. The LED package as set forth in claim 8, further comprising a dam having a designated height and being formed along an edge of the upper surface of the substrate, wherein the LEDs are surrounded by the dam and sealed with epoxy.

10. The LED package as set forth in claim 9, wherein the dam has a tilted inner surface.

11. The LED package as set forth in claim 9, wherein the dam is made of polyphthalamide.

12. The LED package as set forth in claim 9, wherein the epoxy includes a non-YAG fluorescent substance containing Th, Al, O, and Ce.

13. The LED package as set forth in claim 8, wherein the anodes and cathodes of the LEDs are directly electrically connected to the internal electrodes by bonding wires.

14. The LED package as set forth in claim 8, wherein the LEDs are LED flip chips.

* * * * *